United States Patent
Choi et al.

(10) Patent No.: US 12,170,111 B2
(45) Date of Patent: Dec. 17, 2024

(54) NONVOLATILE MEMORY DEVICE INCLUDING SELECTION TRANSISTORS AND OPERATING METHOD THEREOF

(71) Applicant: SK hynix Inc., Gyeonggi-do (KR)

(72) Inventors: Hyung Jin Choi, Gyeonggi-do (KR); Chan Hui Jeong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 145 days.

(21) Appl. No.: 18/103,496

(22) Filed: Jan. 31, 2023

(65) Prior Publication Data

US 2024/0120008 A1 Apr. 11, 2024

(30) Foreign Application Priority Data

Oct. 6, 2022 (KR) ........................ 10-2022-0127646

(51) Int. Cl.
*G11C 16/04* (2006.01)
*G11C 16/10* (2006.01)
*G11C 16/24* (2006.01)
*G11C 16/26* (2006.01)
*G11C 16/34* (2006.01)

(52) U.S. Cl.
CPC .............. *G11C 16/10* (2013.01); *G11C 16/24* (2013.01); *G11C 16/26* (2013.01); *G11C 16/3459* (2013.01); *G11C 16/0483* (2013.01)

(58) Field of Classification Search
CPC ......... G11C 16/10; G11C 16/24; G11C 16/26; G11C 16/3459; G11C 16/0483
USPC ....................................... 365/185.18
See application file for complete search history.

(56) References Cited

U.S. PATENT DOCUMENTS

| | | | | |
|---|---|---|---|---|
| RE47,169 | E * | 12/2018 | Oh ..................... | G11C 16/0483 |
| 10,153,051 | B1 * | 12/2018 | Chen .................. | G11C 16/0483 |
| 2009/0027967 | A1 * | 1/2009 | Lee ..................... | G11C 16/0483 365/185.15 |
| 2016/0055911 | A1 * | 2/2016 | Nguyen ................. | G11C 16/26 365/185.17 |
| 2018/0047449 | A1 * | 2/2018 | Nam .................... | G11C 16/3454 |
| 2019/0019555 | A1 * | 1/2019 | Lee ..................... | G11C 16/0483 |

FOREIGN PATENT DOCUMENTS

| KR | 10-2018-0018923 A | 2/2018 |
|---|---|---|
| KR | 10-2333743 B1 | 12/2021 |

* cited by examiner

*Primary Examiner* — Ly D Pham
(74) *Attorney, Agent, or Firm* — IP & T GROUP LLP

(57) ABSTRACT

An operating method of a non-volatile memory device includes simultaneously performing a program operation on a plurality of selection transistors included in a plurality of cell strings each including a corresponding selection transistor of the selection transistors and a plurality of memory cells, each of the cell strings being coupled between a common source line and a corresponding bit line of a plurality of bit lines; sequentially performing verification operations on respective groups of the selection transistors, the groups being coupled to respective selection lines; and sequentially storing results of the verification operations into respective data latch circuits within each of a plurality of page buffers coupled to the bit lines.

18 Claims, 19 Drawing Sheets

| line | Voltage |
|---|---|
| BL1~BLm | VSS |
| DSL1~DSL4 | VSS or VDSL |
| WL1~WLn | VPASS |
| SSL1 | VPGM |
| SSL2 | VPGM |
| CSL | VSS |

| line | Voltage |
|---|---|
| BL1~BLm | VSENSE |
| DSL1, DSL2 | VPASS |
| DSL3, DSL4 | VSS |
| WL1~WLn | VPASS |
| SSL1 | VREAD |
| SSL2 | VSS |
| CSL | VSS |

NONVOLATILE MEMORY DEVICE INCLUDING SELECTION TRANSISTORS AND OPERATING METHOD THEREOF

CROSS-REFERENCE TO RELATED APPLICATION

The present application claims the benefit of Korean Patent Application No. 10-2022-0127646, filed on Oct. 6, 2022, which is incorporated herein by reference in its entirety.

BACKGROUND

1. Field

Various embodiments of the present invention relate to a program and verification operation on selection transistors of a nonvolatile memory device.

2. Description of the Related Art

Memory devices may be classified into volatile devices and nonvolatile memory devices.

Non-volatile memory devices perform a read/write operation at a relatively lower speed than volatile memory devices but retain stored data even when a power supply is cut off. Accordingly, non-volatile memory devices are frequently used in portable electronic devices for storing data which need to be retained regardless of whether or not power is supplied to the devices.

Examples of non-volatile memory devices include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), and the like.

Recently, in order to improve the degree of integration of the memory devices, a semiconductor memory device having a 3D array structure has been studied.

SUMMARY

Embodiments of the present invention are directed to provide a memory device having an improved threshold voltage distribution of selection transistors.

According to an embodiment of the present invention, an operating method of a memory device includes simultaneously performing a program operation on a plurality of selection transistors included in a plurality of cell strings each including a corresponding selection transistor of the selection transistors and a plurality of memory cells, each of the cell strings being coupled between a common source line and a corresponding bit line of a plurality of bit lines; sequentially performing verification operations on respective groups of the selection transistors, the groups being coupled to respective selection lines; and sequentially storing results of the verification operations into respective data latch circuits within each of a plurality of page buffers coupled to the bit lines.

According to an embodiment of the present invention, a memory device includes a plurality of cell strings each including a corresponding one of a plurality of source selection transistors and a plurality of memory cells, each of the cell strings being coupled between a common source line and a corresponding bit line of a plurality of bit lines; a peripheral circuit including a plurality of page buffers coupled to the cell strings through the respective bit lines, the peripheral circuit being coupled to the source selection transistors through a plurality of source selection lines and coupled to the memory cells through a plurality of word lines; and a control logic configured to control the peripheral circuit to: simultaneously perform a program operation on the source selection transistors, sequentially perform verification operations on respective groups of the source selection transistors, the groups being coupled to the respective source selection lines, and sequentially store results of the verification operations into respective data latch circuits within each of the page buffers.

According to an embodiment of the present invention, a memory device includes cell strings coupled between a bit line and a common source line, each of the cell strings including a selection transistor and memory cells serially coupled to each other, and the selection transistors of the cell strings being classified into groups coupled to respective selection lines; and a control circuit configured to: perform a program operation simultaneously on the selection transistors, perform verification operations on the respective groups to latch results of the respective verification operations, and adjust an operational voltage for a group, for which the latched result represents a fail, to a level lower than the operational voltage for a group, for which the latched result represents a pass, among the groups.

BRIEF DESCRIPTION OF THE DRAWINGS

FIGS. 7A to 9B are diagrams for describing a program operation on the source selection transistors of FIG. 6 in accordance with an embodiment of the present invention, FIGS. 10A to 143 are diagrams for describing verification operations on the source selection transistors of FIG. 6 in accordance with an embodiment of the present invention.

DETAILED DESCRIPTION

Figure 1:
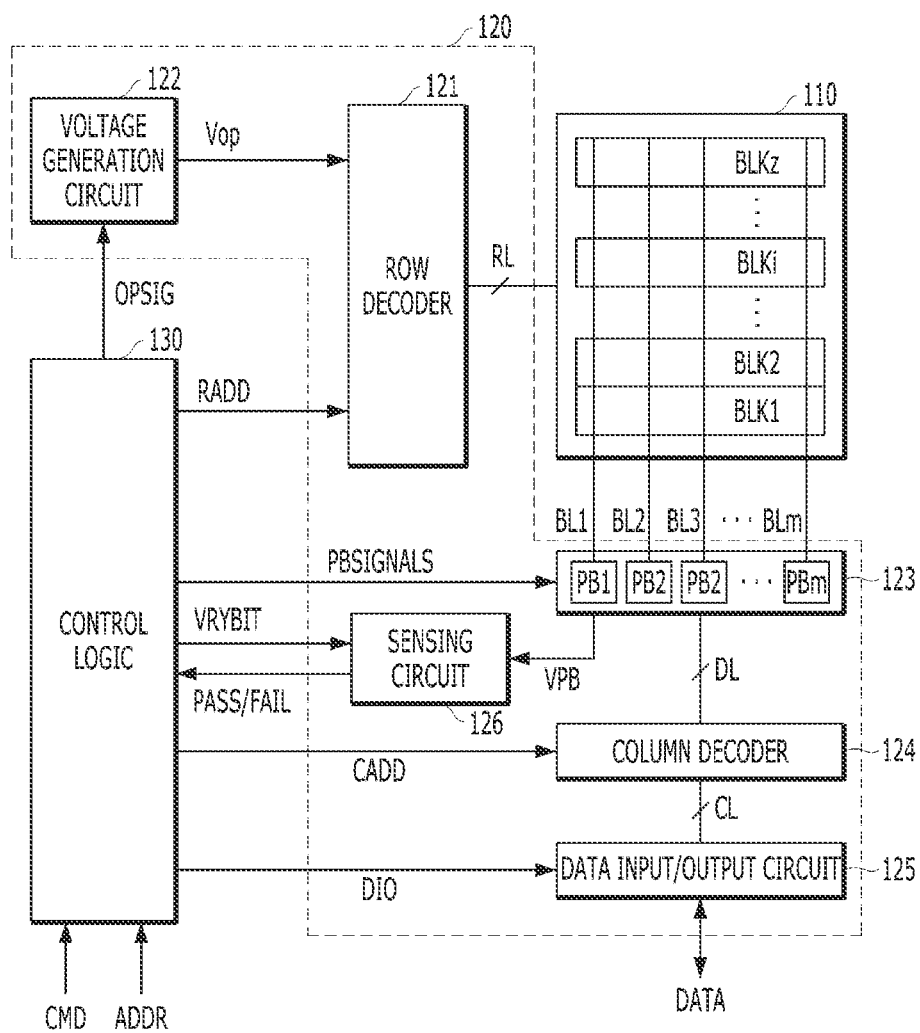
FIG. 1 is a block diagram illustrating a memory device in accordance with an embodiment of the present invention.

Specific structural and functional description provided herein is directed to embodiments of the present invention. The present invention, however, is not limited to the embodiments described herein.

While embodiments are described in detail, the present invention is not limited to any specific detail. The present invention may be embodied in many different forms and should not be construed as being limited to any specific description. Rather, the present invention should be construed to cover not only the disclosed embodiments, but also various alternatives, modifications, equivalents, and other embodiments that fall within the spirit and scope of the present invention.

It will be understood that, although the terms "first", "second", etc. may be used herein to identify various elements, these elements should not be limited by these terms. These terms are only used to distinguish one element from another element that otherwise have the same or similar names, A first element in one instance could be termed a second element in another instance without departing from the teachings of the present invention.

It will be understood that when an element is referred to as being "coupled" or "connected" to another element, it can be directly coupled or connected to the other element or one or more intervening elements may be present therebetween. In contrast, it should be understood that when an element is referred to as being "directly coupled" or "directly connected" to another element, there are no intervening elements present. Other expressions that describe the relationship between elements, such as "between", "directly between", "adjacent to" or directly adjacent to" should be construed in the same way.

The terminology used herein is for the purpose of describing particular embodiments only and is not intended to be limiting. In the present invention, the singular forms are intended to include the plural forms as well, unless the context clearly indicates otherwise. It will be further understood that open ended terms, such as "comprise", "include", "have", etc., when used in this specification, specify the presence of stated features, integers, steps, operations, dements, components, and/or combinations of them but do not preclude the presence or addition of one or more other features, integers, steps, operations, dements, components, and/or combinations thereof.

Unless otherwise defined, all terms including technical and scientific terms used herein have the same meaning as commonly understood by one of ordinary skill in the art to which the present invention belongs. It will be further understood that terms used herein should be interpreted as having a meaning that is consistent with their meaning in the context of this specification and the relevant art and not be interpreted in an idealized or overly formal sense unless expressly so defined herein.

Detailed description of functions and structures well known to those skilled in the art may be omitted to avoid obscuring the subject matter of the present invention. This aims to omit unnecessary description to make the subject matter of the present invention clear.

Various embodiments of the present invention are described more fully below with reference to the accompanying drawings, in which preferred embodiments of the present invention are shown, so that those skilled in the art can easily carry out and practice the present invention.

FIG. 1 is a block diagram illustrating a memory device 100 in accordance with an embodiment of the present invention.

Referring to FIG. 1, the memory device 100 may include a memory cell array 110, a peripheral circuit 120, and a control logic 130.

The memory cell array 110 may include a plurality of memory blocks BLK1 to BLKz, Each of the memory blocks BLK1 to BLKz may have a three-dimensional (3D) structure. Each of the memory blocks BLK1 to BLKz may include a plurality of memory cells that are stacked on a substrate. The memory blocks BLK1 to BLKz may be connected to the peripheral circuit 120 through a plurality of row lines RL and may be coupled to the peripheral circuit 120 through a plurality of bit lines BL1 to BLm. The memory blocks BLK1 to BLKz may be coupled in common to first to m-th bit lines BL1 to BLm.

In an embodiment, the plurality of memory cells may be nonvolatile memory cells. The row lines RL may include a common source line, at least one source selection line, a plurality of word lines, and at least one drain selection line. Memory cells that are coupled to the same word line may be defined as one page. Hence, each memory block may include a plurality of pages.

Each of the memory cells in the memory cell array 110 may be formed as a single level cell (SLC) that is capable of storing data of a single bit, a multi-level cell (MLC) that is capable of storing data of two bits, a triple-level cell (TLC) that is capable of storing data of three bits, or a quad-level cell (QLC) that is capable of storing data of four bits.

The peripheral circuit 120 may perform a program operation, a read operation, or an erase operation on a selected area of the memory cell array 110 under the control of the control logic 130. The peripheral circuit 120 may drive the memory cell array 110. For example, under the control of the control logic 130, the peripheral circuit 120 may supply various operating voltages to the row liens RL and the first to m-th bit lines BL1 to BLm or discharge the applied voltages. The program operation may include one or more program loops. Each of the program loops may include a program voltage application operation for applying a program voltage and a verification operation for verifying a program result by using a verification voltage. The peripheral circuit 120 may perform one or more program loops including the program voltage application and the verification operation on memory cells that are coupled to a selected one of the row lines RL.

In detail, the peripheral circuit 120 may include a row decoder 121, a voltage generation circuit 122, a page buffer group 123, a column decoder 124, a data input/output circuit 125, and a sensing circuit 126.

The row decoder 121 may be coupled to the cell array 110 through the row lines RL. The row decoder 121 may operate under the control of the control logic 130, The row decoder 121 may receive a row address RADD from the control logic 130. In an embodiment, the row decoder 121 may decode the row address RADD to select at least one of the memory blocks BLK1 to BLKz. In an embodiment, the row decoder 121 may decode the row address RADD to select a row line RL of the selected memory block and may transmit operating voltages Vop that are generated by the voltage generation circuit 122 to the selected row line RL.

For example, during the program voltage application operation, the row decoder 121 may apply a program voltage to a selected word line and may apply a program pass voltage having a level that is lower than that of the program voltage to unselected word lines, During the verification operation, the row decoder 121 may apply a verification voltage to a selected word line and apply a verification pass voltage having a level that is higher than that of the verification voltage to unselected word lines. During the read operation, the row decoder 121 may apply a read voltage to a selected word line and apply a read pass voltage having a level that is higher than that of the read voltage to unselected word lines, During the erase operation, the row decoder 121 may decode the row address RADD to select a memory block. During the erase operation, the row decoder 121 may apply a ground voltage to word lines that are coupled to the selected memory block.

In an embodiment, the row decoder 121 may include components, such as an address buffer, a decoder, and the like.

The voltage generation circuit 122 may operate under the control of the control logic 130. The voltage generation circuit 122 may generate the operating voltages Vop by using an external supply voltage that is supplied to the memory device 100. In detail, the voltage generation circuit 122 may generate the operating voltages Vop that are used for the program operation, the read operation, and the erase operation, according to an operation signal OPSIG provided from the control logic 130. For example, the voltage generation circuit 122 may generate the program voltage, the verification voltage, the pass voltage, the verification pass voltage, the read voltage, and an erase voltage.

Depending on an embodiment, the voltage generation circuit 122 may generate an internal supply voltage by regulating the external supply voltage. The internal supply voltage that is generated by the voltage generation circuit 122 may be used as an operating voltage for the memory device 100. Depending on an embodiment, the voltage generation circuit 122 may generate the operating voltages Vop by using the external supply voltage or the internal supply voltage. For example, the voltage generation circuit 122 may include a plurality of pumping capacitors for receiving the internal supply voltage and may generate the operating voltages Vop by selectively enabling the plurality of pumping capacitors under the control of the control logic 130. The generated operating voltages Vop may be supplied to the memory cell array 110 by the row decoder 121.

The page buffer group 123 may include first to m-th page buffers PB1 to PBm. The first to m-th page buffers PB1 to PBm may be coupled to memory cells of the memory cell array 110 through the first to m-th bit lines BL1 to BLm, respectively. The first to m-th page buffers PB1 to PBm may operate under the control of the control logic 130. For example, the first to m-th page buffers PB1 to PBm may operate in response to page buffer control signals PBSIGNALS provided from the control logic 130, The first to m-th page buffers PB1 to PBm may temporarily store data that is transferred through the first to m-th bit lines BL1 to BLm, and sense voltage, or current of the first to m-th bit lines BL1 to BLm.

In an embodiment, during the program voltage application operation when the program voltage is applied to the selected word line, the first to m-th page buffers PB1 to PBm may receive data from the data input/output circuit 125 through data lines DL. The data that is received to the first to m-th page buffers PB1 to PBm may be stored in the memory cells of the selected word line through the first to m-th bit lines BL1 to BLm. Threshold voltages of memory cells that are coupled to a bit line to which a program permission voltage (e.g., a ground voltage) is applied may be increased, and threshold voltages of memory cells that are coupled to a bit line to which a program inhibit voltage (e.g., a power supply voltage) is applied may be maintained.

In an embodiment, during the verification operation, the first to m-th page buffers PB1 to PBm may read out data from selected memory cells through the first to m-th bit lines BL1 to BLm, During the verification operation, the first to m-th page buffers PB1 to PBm may precharge all bit lines to the precharge voltage.

In an embodiment, during the read operation, the first to m-th page buffers PB1 to PBm may read out data from selected memory cells through the first to m-th bit lines BL1 to BLm and may output the read data to the data input/output circuit 125 under the control of the column decoder 124. During the erase operation, the first to m-th page buffers PB1 to PBm may float the first to m-th bit lines BL1 to BLm.

The column decoder 124 may operate under the control of the control logic 130. The column decoder 124 may transfer data between the data input/output circuit 125 and the page buffer group 123 in response to a column address CADD provided from the control logic 130. For example, the column decoder 124 may exchange data with the first to m-th page buffers PB1 to PBm through the data lines DL or may exchange data with the data input/output circuit 125 through data lines CL.

The data input/output circuit 125 may operate under the control of the control logic 130. The data input/output circuit 125 may be coupled to the first to m-th page buffers PB1 to PBm through the data lines DL, Depending on an embodiment, the data input/output circuit 125 may include a plurality of input/output buffers (not shown) for receiving/outputting the data in response to input/output control signals DIO provided from the control logic 130, During the program operation, the data input/output circuit 125 may receive the data to be stored from the memory controller 200. During the read operation, the data input/output circuit 125 may output, to the memory controller 200, the data from the first to m-th page buffers PB1 to PBm.

The sensing circuit 126 may generate a reference current in response to an enable bit signal VRYBIT generated by the control logic 130 and may output a pass or fail signal PASS/FAIL to the control logic 130 by comparing a sensing voltage VPB that is received from the page buffer group 123 with a reference voltage that is generated by the reference current.

The control logic 130 may be coupled to the row decoder 121, the voltage generation circuit 122, the page buffer group 123, the column decoder 124, the data input/output circuit 125, and the sensing circuit 126, The control logic 130 may control the overall operation of the memory device 100. The control logic 130 may be operated in response to a command CMD and an address ADDR that are transmitted from an external device. The control logic 130 may control the peripheral circuit 120 by generating various types of signals in response to the command CMD and the address ADDR. For example, the control logic 130 may generate the operation signal OPSIG, the row address RADD, the page buffer control signals PBSIGNALS, the column address CADD, the input/output control signals DIO, and the enable bit signal VRYBIT in response to the command CMD and the address ADDR. The control logic 130 may output the operation signal OPSIG to the voltage generation circuit 122, output the row address RADD to the row decoder 121, output the page buffer control signals PBSIGNALS to the page buffer group 123, output the column address CADD to the column decoder 124, output the input/output control signals DIO to the data input/output circuit 125, and output the enable bit signal VRYBIT to the sensing circuit 126. In addition, the control logic 130 may determine whether the verification operation is pass or fail in response to the pass or fail signal PASS/FAIL that is output from the sensing circuit 126.

Figure 2:
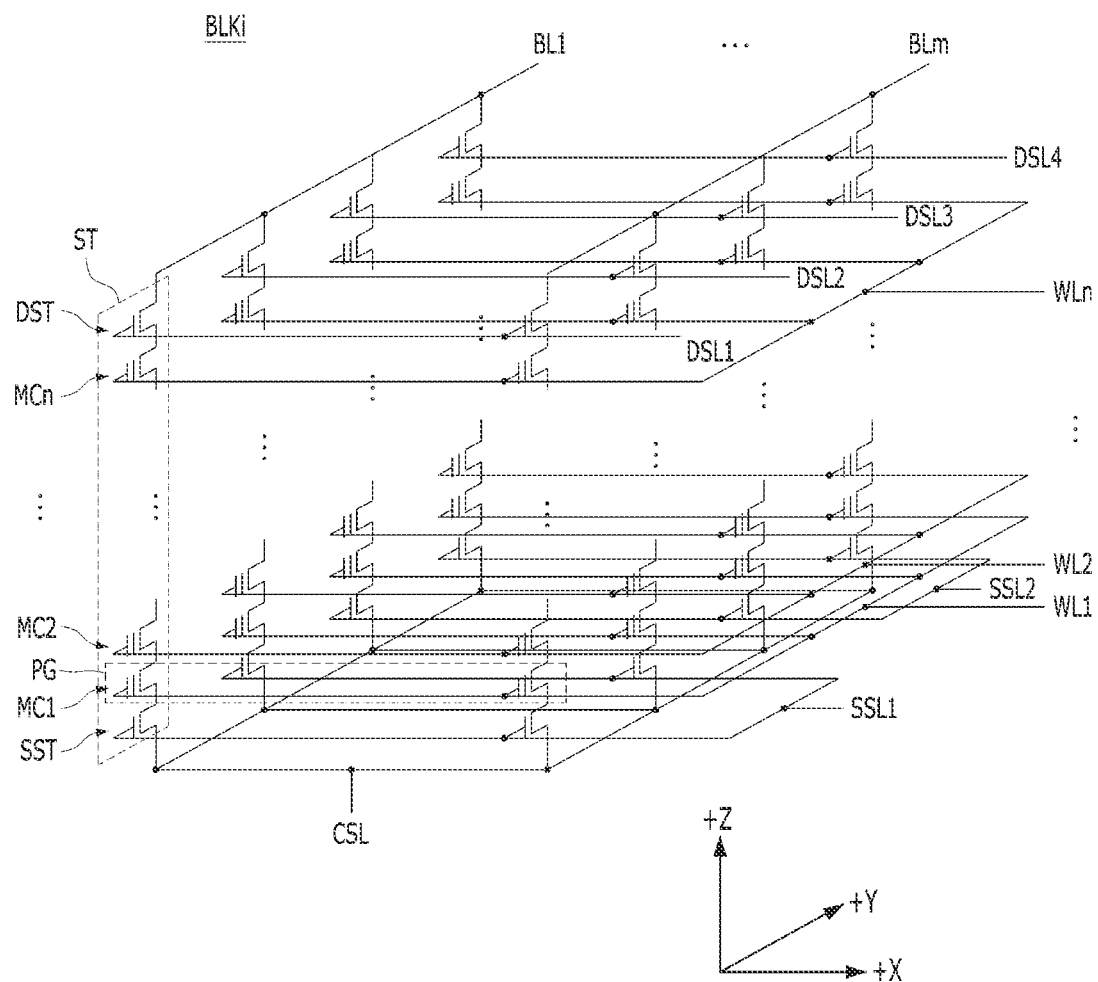
FIG. 2 is a diagram illustrating a detailed structure of a representative memory block of a plurality of memory blocks of FIG. 1 in accordance with an embodiment of the present invention.
Figure 3:
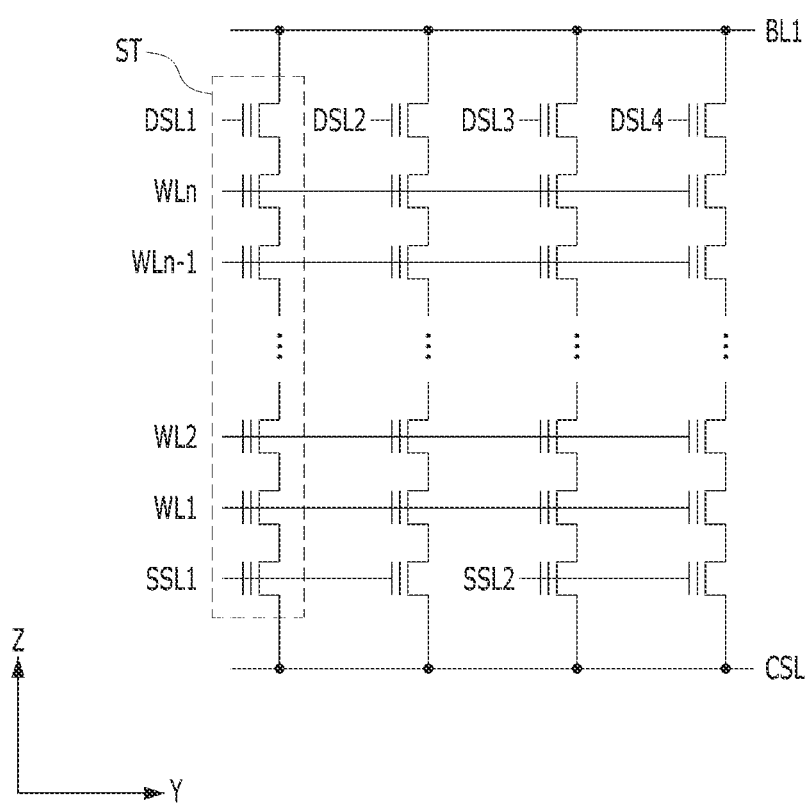
FIG. 3 is a diagram illustrating a detailed structure of representative cell strings connected to the same bit line in the memory block of FIG. 2 in accordance with an embodiment of the present invention.

FIG. 2 is a diagram illustrating a detailed structure of a representative memory block BLKi of the plurality of memory blocks BLK1 to BLKz of FIG. 1 in accordance with an embodiment of the present invention. FIG. 3 is a diagram illustrating a detailed structure of representative cell strings ST connected to the same bit line in the memory block BLKi of FIG. 2 in accordance with an embodiment of the present invention.

Referring to FIGS. 2 and 3, the memory block BLKi may include a plurality of cell strings ST that are coupled between a plurality of bit lines BL1 to BLm and a common source line CSL. The bit lines BL1 to BLm may be respectively coupled to a predetermined number of the cell strings ST, and the common source line CSL may be coupled in common to the cell strings ST. Each of the cell strings ST may include a source selection transistor SST, a plurality of memory cells MC1 to MCn, and a drain selection transistor DST.

Gates of the source selection transistors SST included in different cell strings ST coupled to different bit lines BL1 to BLm may be coupled to a first source selection line SSL1 and to a second source selection line SSL2. For example, among the source selection transistors SST, source selection transistors that are adjacent to each other in a second direction Y may be coupled to the same source selection line.

For example, when the source selection transistors SST are sequentially arranged along the second direction Y, the gates of the source selection transistors SST which are arranged from the first source selection transistor SST in a first direction X and which are included in different cell strings ST, and the gates of the source selection transistors SST which are arranged from the second source selection transistor SST in the first direction X and which are included in different cell strings ST may be coupled to the first source selection line SSL1. Also, the gates of the source selection transistors SST which are arranged from the third source selection transistor SST in the first direction X and which are included in different cell strings ST, and the gates of the source selection transistors SST which are arranged from the fourth source selection transistor SST in the first direction X and which are included in different cell strings ST may be coupled to the second source selection line SSL2.

Gates of the memory cells MC1 to MCn may be respectively coupled to the word lines WL1 to WLn, and gates of the drain selection transistors DST may be coupled to one of first to fourth drain selection lines DSL1 to DSL4. The gates of the drain selection transistors DST arranged in the first direction X, among the drain selection transistors DST, may be coupled in common to the same drain selection line (e.g., DSL1), but the gates of the drain selection transistors DST arranged in the second direction Y may be coupled to different drain selection lines DSL1 to DSL4.

For example, when the drain selection transistors DST are sequentially arranged along the second direction Y, the gates of the drain selection transistors DST which are arranged from the first drain selection transistor DST in the first direction X and which are included in different cell strings ST may be coupled to the first drain selection line Da1. The drain selection transistors DST, arranged from the drain selection transistors DST coupled to the first drain selection line Da1 in the second direction Y, may be sequentially coupled to the second to fourth drain selection lines DSL2 to DSL4. Therefore, in the selected memory block BLKi, the cell strings ST coupled to the selected drain selection line may be selected, and the cell strings ST coupled to the remaining drain selection lines, that is, unselected drain selection lines, may be unselected.

The memory cells coupled to the same word line may form one page PG. Here, the term "page" means a physical page. For example, among the cell strings ST coupled to the first to m-th bit lines BL1 to BLm, a group of memory cells coupled in the first direction X in the same word line is referred to as a page PG. For example, among the first memory cells MC1 coupled to the first word line WL1, memory cells arranged in the first direction X may form one page PG. Among the first memory cells MC1 coupled in common to the first word line WL1, memory cells arranged in the second direction Y may be divided into different pages. Therefore, when the first drain selection line DSL1 is a selected drain selection line and the first word line WL1 is a selected word line, a page coupled to the first drain selection line DSL1, among a plurality of pages PG coupled to the first word line WL1, may be the selected page. The pages which are coupled in common to the first word line WL1 but are coupled to unselected second to fourth drain selection lines DSL2 to DSL4 may be unselected pages.

In the case in which each memory cell is a single level cell (SLC) that is capable of storing data of one bit, each physical page PG may store one logical page (LPG) of data. Each memory cell may store data of two or more bits. In this case, each physical page PG may store two or more LPGs of data.

Although, in FIGS. 2 and 3, one source selection transistor SST and one drain selection transistor DST are illustrated as being included in one cell string ST, a plurality of source selection transistors SST and a plurality of drain selection transistors DST may be included in one cell string ST depending on the memory device. Also, dummy cells may be included between the source selection transistor SST, the memory cells MC1 to MCn, and the drain selection transistor DST depending on the memory device. The dummy cells do not store user data like the normal memory cells MC1 to MCn, but may be used to improve the electrical characteristics of each cell string ST. However, since the dummy cells are optional components, a detailed description thereof is omitted here.

In FIG. 2 the common source line CSL, the source selection line SSL, the word lines WL1 to WLn, and the drain selection line DSL may correspond to the row lines RL of FIG. 1. That is, the common source line CSL, the source selection line SSL, the word lines WL1 to WLn, and the drain selection line DSL may be controlled by the row decoder 121 of FIG. 1.

Moreover, in a memory device with a 3D array structure, a configuration has been proposed in which source selection transistors SST and/or drain selection transistors DST are implemented with the same structure as memory cells MC1 to MCn. The memory device may electrically connect or electrically isolate the memory cells MC1 to MCn to a common source line CSL by controlling the source selection transistors SST. If threshold voltages of the source selection transistors SST are significantly different from a desired voltage distribution, the source selection transistors SST cannot be effectively controlled.

When the source selection transistors SST have the threshold voltages higher than the desired voltage distribution then when performing an arbitrary operation while turning on the source selection transistors SST, the current flowing through the source selection transistors SST to the common source line CSL may be unwantedly reduced. That is, the amount of current flowing to the common source line CSL through the cell string ST may be lowered. When the source selection transistors SST have the threshold voltages lower than the desired threshold voltage then when an arbitrary operation is performed while turning off the source selection transistors SST, the current may unintentionally flow out to the common source line CSL through the source selection transistors SST. Therefore, effectively setting the threshold voltages of the source selection transistors SST is an important factor in improving reliability of the memory device.

Accordingly, the control logic 130 of the memory device 100 may control the peripheral circuit 120 to perform the program operation and the verification operation of the source selection transistors SST so that the threshold voltages of the source selection transistors SST may be included in the desired voltage range. The program operation of the source selection transistors SST may be performed prior to the program operation of the memory cells MC1 to MCn of each page.

According to an embodiment of the present invention, the control logic 130 may control the peripheral circuit 120 to simultaneously program all source selection transistors SST included in the cell strings ST. During a program operation on the source selection transistors SST, the row decoder 121 and the voltage generator 122 may provide the program voltage to the source selection lines SSL1 and SSL2 under the control of the control logic 130, and apply a ground voltage to the common source line CSL. During a program operation on the source selection transistors SST, the first to m-th page buffers PB1 to PBm may apply the ground voltage to the bit lines BL1 to BLm under the control of the control logic 130.

In addition, the control logic 130 may select a group of selection transistors SST connected to the same source selection line and control the peripheral circuit 120 to sequentially store the verification results for the selected group in a plurality of data latch circuits inside each page buffer connected to the bit lines BL1 to BLm. During the verification operation of the source selection transistors SST, the first to m-th page buffers PB1 to PBm may sequentially store the verification results for each group of the source selection transistors SST connected to the same source selection line in the data latch circuits under the control of the control logic 130. The control logic 130 may set an operational voltage for each group of the source selection transistors SST based on the verification results stored in the data latch circuits. According to an embodiment, the sensing circuit 126 may generate the pass or fail signal PASS/FAIL based on the verification results stored in the data latch circuits, and the control logic 130 may set an operational voltage for each group of the source selection transistors SST in response to the pass or fail signal PASS/FAIL, Accordingly, the reliability of the memory device 100 may be improved.

Figure 4:
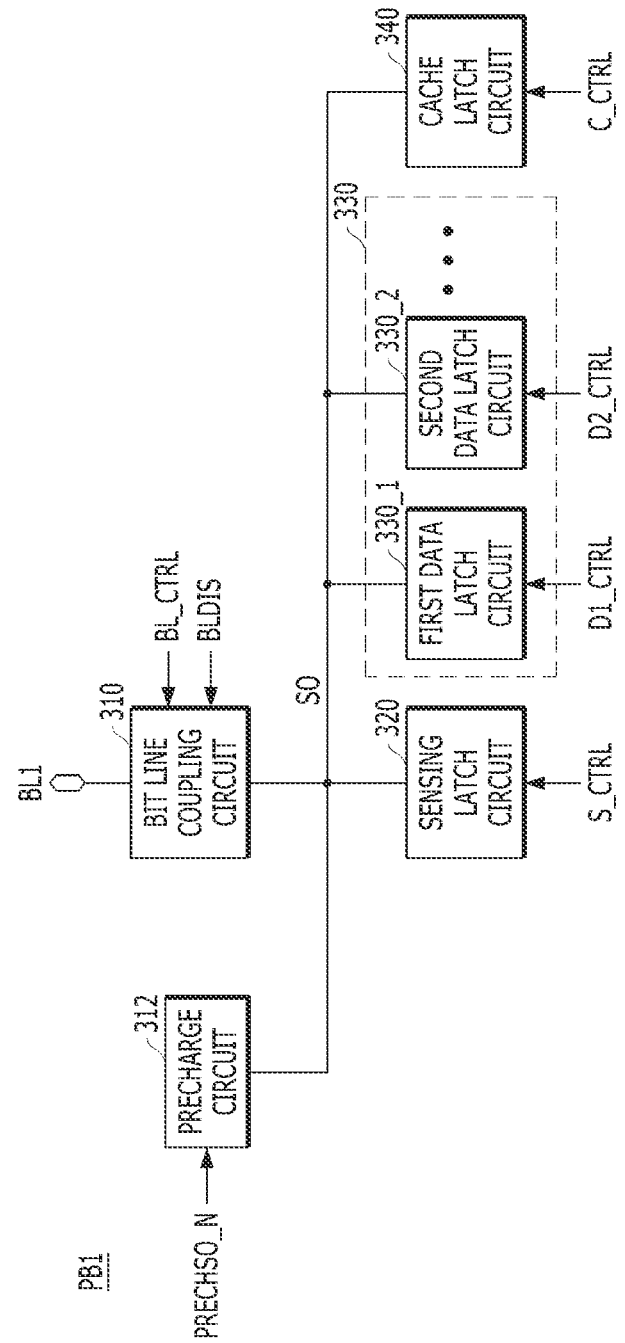
FIG. 4 is a block diagram illustrating a detailed structure of a representative page buffer of the page buffers of FIG. 1 in accordance with an embodiment of the present invention.

FIG. 4 is a block diagram illustrating a detailed structure of the first page buffer PB1 of the first to m-th page buffers PB1 to PBm of FIG. 1 in accordance with an embodiment of the present invention.

Referring to FIG. 4, the first page buffer PB1 may include a bit line coupling circuit 310, a precharge circuit 312, a sensing latch circuit 320, a plurality of data latch circuits 330, and a cache latch circuit 340. The first page buffer PB1 may be controlled based on the page buffer control signals PBSIGNALS generated in the control logic 130 of FIG. 1. That is, signals for controlling the first page buffer PB1 may be included in the page buffer control signals PBSIGNALS.

The bit line coupling circuit 310 may be selectively coupled to the first bit line BL1 according to a coupling control signal BL_CTRL, transfer input data transmitted from a sensing node SO to the first bit line BL1 during a program operation, and sense data transmitted through the first bit line BL1 during a read operation. In addition, the bit line coupling circuit 310 may discharge the first bit line BL1 according to the coupling control signal BL_CTRL and a bit line discharge signal BLDIS.

According to an embodiment, the bit line coupling circuit 310 may precharge the first bit line BL1 to a ground voltage level during a program operation of the source selection transistors SST, A detailed description thereof will be described with reference to FIG. 8.

The precharge circuit 312 may precharge the sensing node SO to a core voltage level based on a precharge signal PRECHSO_N.

The sensing latch circuit 320 may store sensing data by sensing a change in a voltage level at the sensing node SO according to a sensing latch control signal S_CTRL. The sensing data has a preset logic level as an initial value, and the logic level may be maintained or reversed according to the data transmitted through the first bit line BL1 during a read operation or a verification operation. The sensing latch circuit 320 may dump sensing data to the cache latch circuit 340 during a read operation according to the sensing latch control signal S_CTRL. During the read operation or the verification operation, the sensing latch circuit 320 may provide the voltage of the stored sensing data to the sensing circuit (126 in FIG. 1) as the sensing voltage (VPB in FIG. 1).

According to an embodiment, the sensing latch circuit 320 may precharge the first bit line BL1 by setting the sensing data to a specific logic level (e.g., a logic high level) during a program operation of the source selection transistors SST. A detailed description thereof will be described in FIGS. 9A and 9B. In addition, the sensing latch circuit 320 may sequentially dump the sensing data into the plurality of data latch circuits 330 during a verification operation of the source selection transistors SST. A detailed description thereof will be described with reference to FIGS. 11 and 13B.

The cache latch circuit 340 may output the dumped data to the outside through the data input/output circuit (125 in FIG. 1) according to a cache latch control signal C_CTRL. According to an embodiment, the cache latch circuit 340 may transmit data input through the data input/output circuit 125 to the plurality of data latch circuits 330.

The plurality of data latch circuits 330 may store the input data and transfer the stored data to the sensing node SO during the program operation according to a plurality of data control signals D1_CTRL, D2_CTRL, . . . . The number of data latch circuits 330 may be designed differently according to the number of data distributions stored in the memory cell, and may be provided in a number corresponding to a single-level cell, a multi-level cell, or a triple-level cell. For example, if data corresponding to a triple-level cell is input, first to third data latch circuits are provided, the first data latch circuit may receive data corresponding to a Most Significant Bit (MSB), the second data latch circuit may receive data corresponding to a Central Significant Bit (CSB), and the third data latch circuit may receive data corresponding to a Least Significant Bit (LSB).

According to an embodiment, the plurality of data latch circuits 330 may receive and sequentially store the verification results for each group of the source selection transistors, transmitted from the first bit line BL1 through the sensing latch circuit 320, during the verification operation of the source selection transistors SST. The sensing circuit 126 may receive a voltage of data stored in the data latch circuits 330 as the sensing voltage VPB during the verification operation of the source selection transistors SST.

Moreover, the first page buffer PB1 may include one or more verification latch circuits in addition to the above configuration, but a description of the remaining configuration be omitted so as to describe the gist of the invention.

Figure 5:
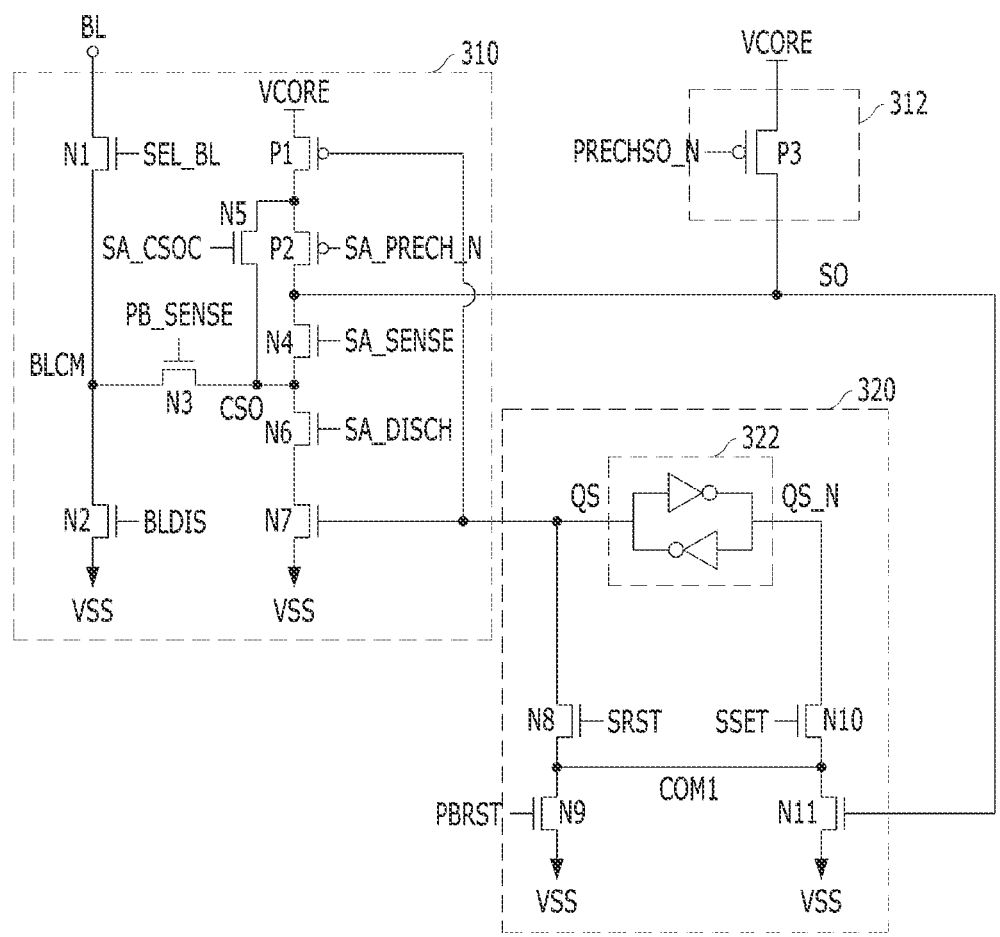
FIG. 5 is a circuit diagram illustrating a partial configuration of the page buffer of FIG. 4 in more detail in accordance with an embodiment of the present invention.

FIG. 5 is a circuit diagram illustrating a partial configuration of the first page buffer PB1 of FIG. 4 in more detail in accordance with an embodiment of the present invention.

Referring to FIG. 5, a detailed configuration of the bit line coupling circuit 310, the precharge circuit 312, and the sensing latch circuit 320 is shown.

The bit line coupling circuit 310 may include first to seventh NMOS transistors N1 to N8 and first and second PMOS transistors P1 and P2. The first NMOS transistor N1 and the second NMOS transistor N2 are connected in series between the first bit line BL1 and a ground voltage (VSS) terminal, and receive a bit line selection signal SEL_BL and the bit line discharge signal BLDIS as a gate, respectively. The third NMOS transistor N3 is connected between a common node BLCM of the first NMOS transistor N1 and the second NMOS transistor N2, and a current sensing node CSO, to receive a bit line sensing signal PB_SENSE through a gate. The first and second PMOS transistors P1 and P2 and the fourth NMOS transistor N4 are connected in series between a core voltage (VCORE) terminal and the current sensing node CSO, to receive a signal at a positive sensing node QS, a precharge control signal SA_PRECH_N, and a sensing control signal SA_SENSE, respectively. The fifth NMOS transistor N5 is connected between a common node of the first and second PMOS transistors P1 and P2 and the current sensing node CSO to receive a sense amplifier coupling signal SA_CSOC through a gate. The sixth and seventh NMOS transistors N6 and N7 are connected between the current sensing node CSO and the ground voltage (VSS) terminal, to receive the sense amplifier discharge signal SA_DISCH and the signal at the positive sensing node QS, respectively.

With the above configuration, the bit line coupling circuit 310 may transmit the input data transmitted from the sensing node SO to the first bit line BL1, or transmit the data from the first bit line BL1 to the sensing node SO, based on the bit line selection signal SEL_BL, the bit line sensing signal PB_SENSE, and the sensing control signal SA_SENSE. In addition, the bit line coupling circuit 310 may discharge the first bit line BL1 to the ground voltage level according to the bit line selection signal SEL_BL and the bit line discharge signal BLDIS. For reference, the bit line selection signal SEL_BL, the bit line sensing signal PB_SENSE, and the sensing control signal SA_SENSE may correspond to the coupling control signal of FIG. 4.

The precharge circuit 312 may include a third PMOS transistor P3, The third PMOS transistor P3 is connected between the core voltage (VCORE) terminal and the sensing node SO, to receive the precharge signal PRECHSO_N through a gate. The precharge circuit 312 may precharge the sensing node SO to the core voltage level based on the precharge signal PRECHSO_N.

The sensing latch circuit 320 may store sensing data for a sensing operation on the data transmitted through the first bit line BL1 based on a sensing reset signal SRST and a sensing set signal SSET, The sensing latch circuit 320 may include a sensing latch 322 and eighth to eleventh NMOS transistors N8 to N11. The sensing latch 322 may be configured with two inverters cross-coupled and connected between the positive sensing node QS and a negative sensing node QS_N. The eighth NMOS transistor N8 and the ninth NMOS transistor N9 are connected in series between the positive sensing node QS and the ground voltage (VSS) terminal, to receive the sensing reset signal SRST and a page reset signal PBRST as a gate, respectively. The tenth NMOS transistor N10 is connected between the negative sensing node QS_N and a first common node COM1 of the eighth NMOS transistor N8 and the ninth NMOS transistor N9, to receive the sensing set signal SSET through a gate. The eleventh NMOS transistor N11 is connected between the first common node COM1 and the ground voltage (VSS) terminal, to receive the signal at the sensing node SO as a gate to form a current path connected to the ground voltage (VSS) terminal based on the voltage level at the sensing node SO.

With the above configuration, the sensing latch circuit 320 may store the sensing data based on the sensing reset signal SRST and the sensing set signal SSET during the read operation or the verification operation. For reference, the sensing reset signal SRST, the sensing set signal SSET, and the page reset signal PBRST may correspond to the sensing latch control signal S_CTRL of FIG. 4.

Hereinafter, a method of performing a program operation on source selection transistors according to an embodiment of the present invention will be described with reference to FIGS. 1 to 15.

Figure 6:
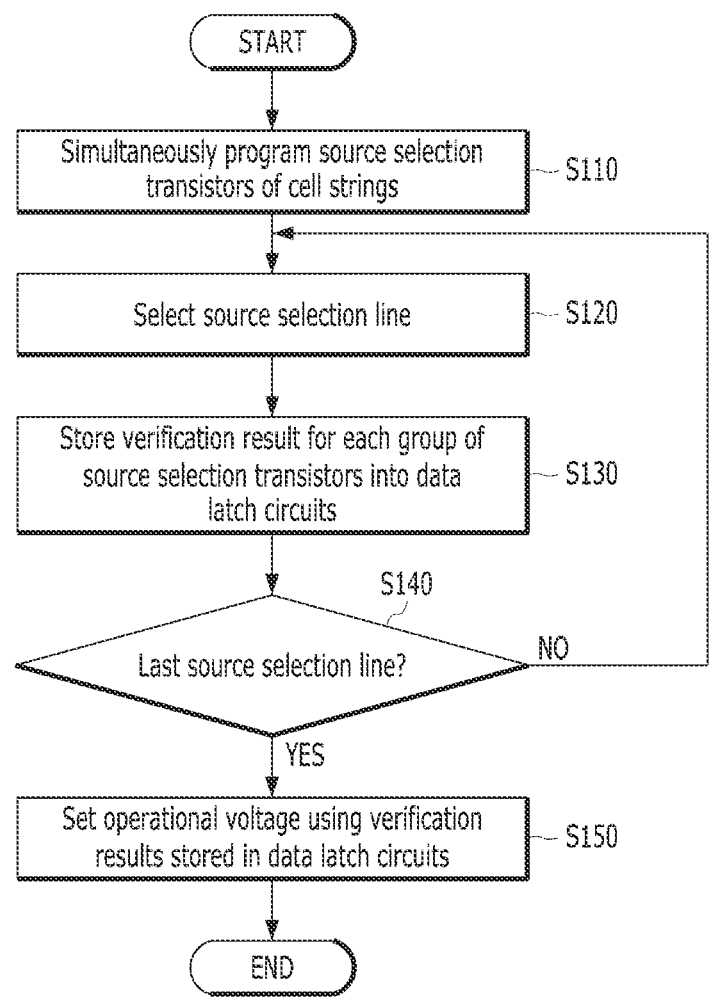
FIG. 6 is a flowchart for describing a program method of source selection transistors in accordance with an embodiment of the present invention.

FIG. 6 is a flowchart for describing a program method of source selection transistors in accordance with an embodiment of the present invention. FIGS. 7A to 9B are diagrams for describing a program operation on the source selection transistors (S110 of FIG. 6) in accordance with an embodiment of the present invention. FIGS. 10A to 14B are diagrams for describing verification operations on the source selection transistors (S130 of FIG. 6) in accordance with an embodiment of the present invention.

Referring to FIG. 6, the control logic 130 may control the peripheral circuit 120 to program the source selection transistors SST of the cell strings ST. For example, referring to FIGS. 1 and 3, the peripheral circuit 120 may simultaneously program the source selection transistors SST included in the cell strings ST connected between the bit lines BL1 to BLm and the common source line CSL (at operation S110). That is, the peripheral circuit 120 may perform a program operation on all source selection transistors SST connected to the first source selection line SSL1 and the second source selection line SSL2. The program operation may be performed using a program voltage having a fixed voltage level.

Figures 7A, 7B:
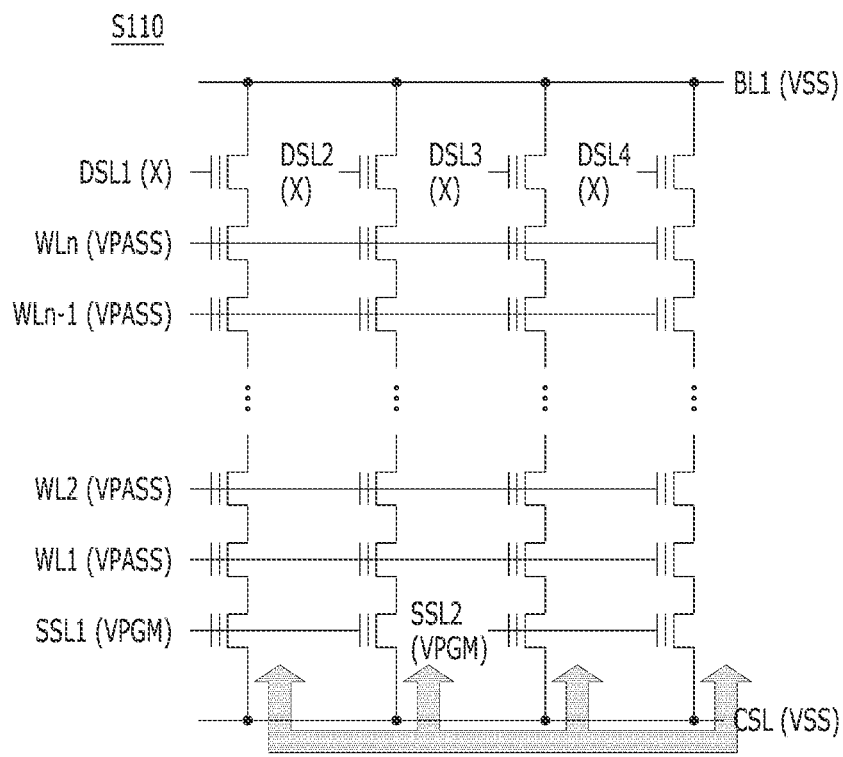

Referring to FIGS. 7A and 7B, during the program operation, the control logic 130 may control the row decoder 121 and the voltage generator 122 to apply a ground voltage VSS to the common source line CSL, a pass voltage VPASS to the word lines WL1 to WLn, and a program voltage VPGM to the first source selection line SSL1 and the second source selection line SSL2. The pass voltage VPASS may have a voltage level capable of turning on the memory cells MC1 to MCn connected to the word lines WL1 to WLn, and have a voltage level greater than or identical to a source voltage. The program voltage VPGM may have a voltage level higher than the pass voltage VPASS. In this case, the control logic 130 may control the row decoder 121 and the voltage generator 122 to apply the ground voltage VSS or a drain selection voltage VDSL to the first to fourth drain selection lines DSL1 to DSL4. The drain selection voltage VDSL may have a voltage level capable of turning on the drain selection transistors DST.

In addition, the control logic 130 may control the first to m-th page buffers PB1 to PBm to apply the ground voltage VSS to the bit lines BL1 to BLm.

Figure 8:
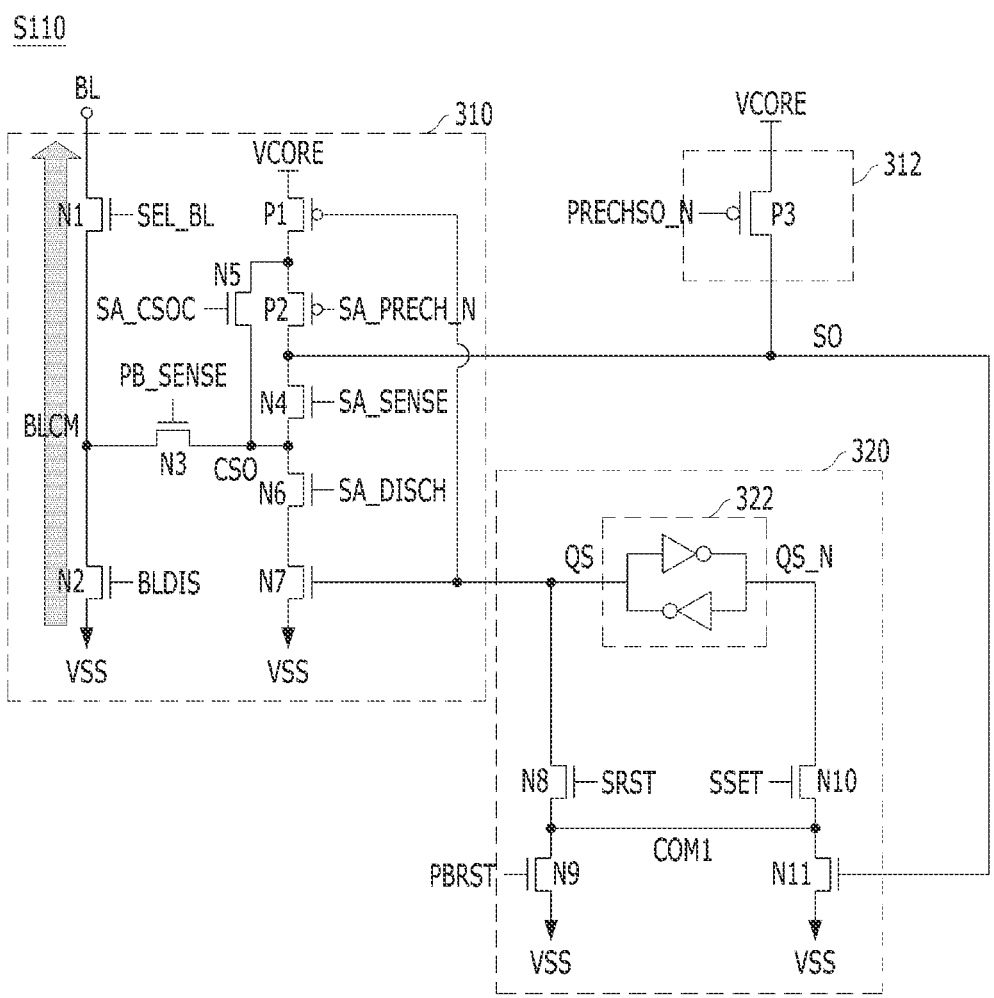

According to an embodiment, referring to FIG. 8, the control logic 130 may provide the bit line selection signal SEL_BL of a logic high level and the bit line discharge signal BLDIS of a logic high level to the first page buffer PB1. Accordingly, the first NMOS transistor N and the second NMOS transistor N2 of the first page buffer PB1 may be turned on to drive the first bit line BL1 to a ground voltage level.

Figure 9A:
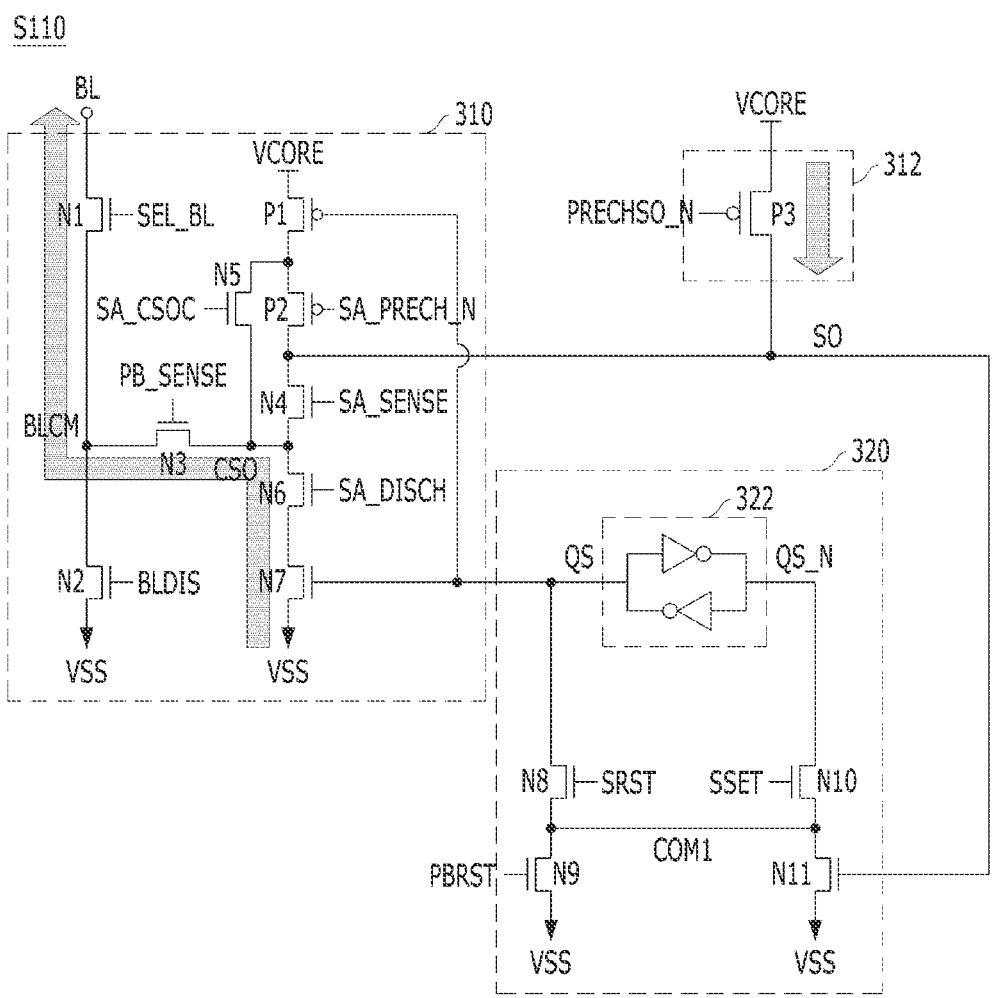
Figure 9B:
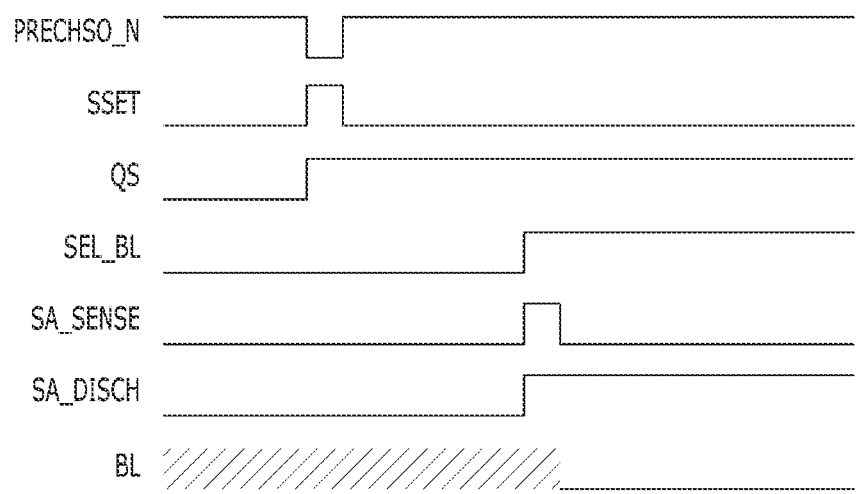

According to another embodiment, referring to FIGS. 9A and 9B, the control logic 130 may provide the precharge signal PRECHSO_N of a logic low level and the sensing set signal SSET of a logic high level to the first page buffer PB1. Accordingly, the third PMOS transistor P3 of the first page buffer PB1 is turned on so that the sensing node SO is precharged to the core voltage level, and the tenth NMOS transistor N10 and the eleventh NMOS transistor N11 are turned on so that the negative sensing node QS_N is initialized to a logic low level. Accordingly, the seventh NMOS transistor N7 is maintained in a turned-on state. Thereafter, the control logic 130 may provide the bit line selection signal SEL_BL of a logic high-level, the bit line sensing signal PB_SENSE of a logic high-level, and the sense amplifier discharge signal SA_DISCH of a logic high-level to the first page buffer PB1. Accordingly, the first NMOS transistor N1, the third NMOS transistor N3, and the sixth NMOS transistor N6 of the first page buffer PB1 are additionally turned on to drive the first bit line BL1 to the ground voltage level.

As described above, during the program operation, the ground voltage VSS is applied to the common source line CSL, the pass voltage VPASS is applied to the word lines WL1 to WLn, the ground voltage VSS is applied to the first bit line BL1, and the program voltage VPGM is applied to the first source selection line SSL1 and the second source selection line SSL2. Thus, threshold voltages of the memory cells MC1 to MCn may be maintained, while threshold voltages of the source selection transistors SST may increase. Accordingly, the source selection transistors SST may be programmed. In this case, the drain selection transistors DST may maintain a turn-on state or a turn-off state. That is, the source selection transistors SST may be programmed regardless of states of the drain selection transistors DST.

Moreover, the program operation of the source selection transistors SST may be performed before storing data into the memory cells MC1 to MCn. In this case, the threshold voltages of the memory cells MC1 to MCn during the program operation of the source selection transistors SST may be lower than the ground voltage level, Therefore, even if the ground voltage VSS is applied to the word lines WL1 to WLn, the memory cells MC1 to MCn may be turned on.

Referring back to FIG. 6, the control logic 130 may control the peripheral circuit 120 to sequentially select the first source selection line Sal and the second source selection line SSL2 (at operation S120). For example, the row decoder 121 may decode the row address RADD provided from the control logic 130 to select the first source selection line SSL1. The control logic 130 may control the peripheral circuit 120 to perform a verification operation on a group of the source selection transistors SST connected to the selected first source selection line SSL1 and store the verification result in one of the plurality of data latch circuits 330 of the first to m-th page buffers PB1 to PBm (at operation S130).

Figures 10A, 10B:
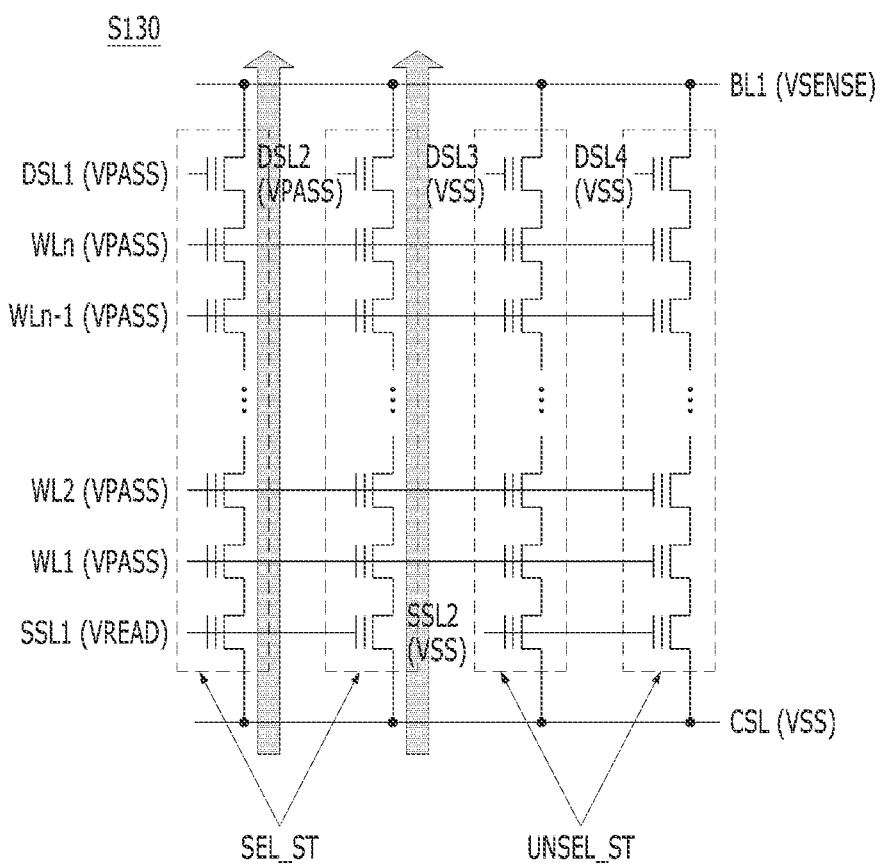

Referring to FIGS. 10A and 10B, during the verification operation, the control logic 130 may control the first to m-th page buffers PB1 to PBm to provide a predetermined voltage or current (e.g., sensing voltage VSENSE) to the bit lines BL1 to BLm. For reference, the sensing voltage VSENSE may have a level reduced by a threshold voltage of transistors in the page buffer from the core voltage level. In addition, the control logic 130 may control the row decoder 121 and the voltage generator 122 to apply the ground voltage VSS to the unselected second source selection line SSL2, while applying a read voltage VREAD to the selected first source selection line SSL1, The read voltage VREAD may be a voltage level greater than the ground voltage VSS but lower than the pass voltage VPASS. The control logic 130 may control the row decoder 121 and the voltage generator 122 to apply the ground voltage VSS to the common source line CSL while applying the pass voltage VPASS to the word lines WL1 to WLn.

In addition, the control logic 130 may control the row decoder 121 and the voltage generator 122 to apply the pass voltage VPASS to the first drain selection line DSL1 and the second drain selection line DSL2 of the cell strings ST (SEL_ST in FIG. 10B) connected to the selected second source selection line SSL1, while applying the ground voltage VSS to the third drain selection line DSL3 and the fourth drain selection line DSL4 of the cell strings ST (UNSEL_ST in FIG. 10B) connected to the unselected second source selection line SSL2. Accordingly, the drain selection transistors DST, the memory cells MC1 to MCn, and the source selection transistors SST of the cell strings SEL_ST connected to the selected first source selection line SSL1 may be turned on. On the other hand, the drain selection transistors DST and the source selection transistors SST of the cell strings UNSEL_ST connected to the unselected second source selection line SSL2 may be turned off.

Figure 11:
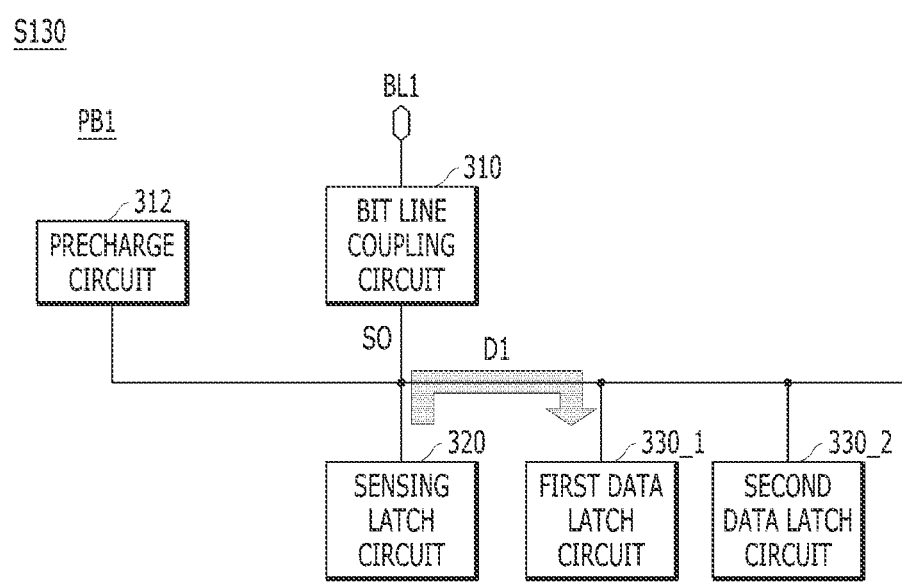

The control logic 130 may control the first to m-th page buffers PB1 to PBm to store a change in voltage or current output through the first bit line BL1 from the cell strings SEL_ST connected to the selected first source selection line SSL1, into the first data latch circuit 3301. Referring to FIG. 11, the bit line coupling circuit 310 may sense the data transmitted through the first bit line BL1 and transmit the sensed data to the sensing node SO. The sensing latch circuit 320 may store the sensing data depending on output data transmitted through the first bit line BL1, and may dump the stored sensing data into the first data latch circuit 330_1 (as shown in D1). Accordingly, the verification result of the group of the source selection transistors SST connected to the first source selection line SSL1 may be stored in the first data latch circuit 330_1.

Figure 12A:
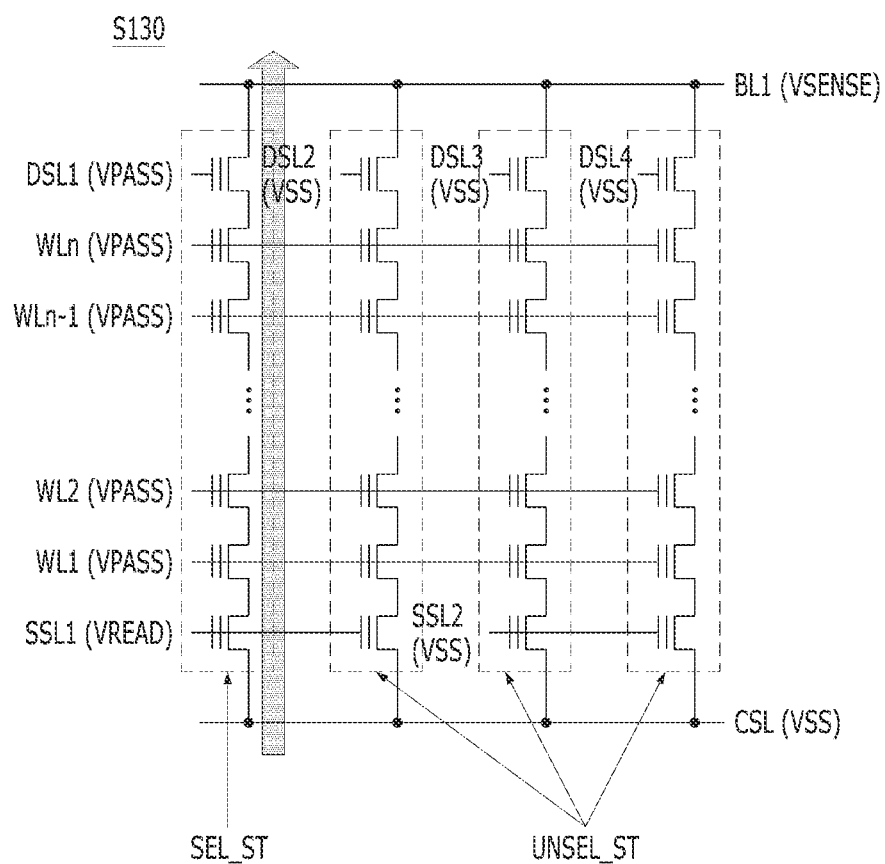
Figure 12B:
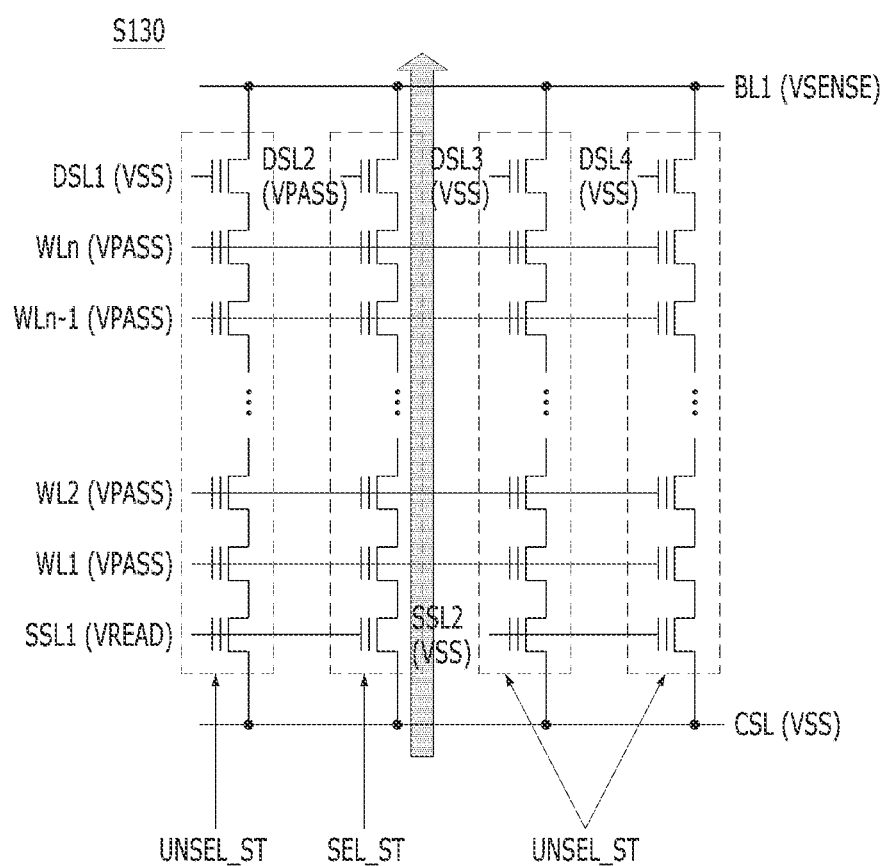

According to another embodiment, during the verification operation, the control logic 130 may control the row decoder 121 and the voltage generator 122 to sequentially select the cell strings connected to the selected first source selection line SSL1, For example, referring to FIG. 12A, the row decoder 121 and the voltage generator 122 may select a cell string SEL_ST by applying the pass voltage VPASS to only the first drain selection line DSL1. The sensing latch circuit 320 may store the sensing data depending on output data transmitted through the first bit line BL1. Thereafter, referring to FIG. 123, the row decoder 121 and the voltage generator 122 may select a cell string SEL_ST by applying the pass voltage VPASS only to the second drain selection line DSL2. The sensing latch circuit 320 may store the sensing data depending on output data transmitted through the first bit line BL1. In this case, if any of the selected cell strings SEL_ST in FIG. 12A or SEL_ST in FIG. 12B is normally programmed, the sensing data stored in the sensing latch circuit 320 may be stored accordingly as the program operation has finally passed. As described in FIG. 11, the control logic 130 may control the first to m-th page buffers PB1 to PBm to dump the sensing data stored in the sensing latch circuit 320 into the first data latch circuit 30_1 (as shown in D1). Accordingly, the verification result of the group of the source selection transistors SST connected to the first source selection line SSL1 may be stored in the first data latch circuit 330_1.

Referring back to FIG. 6, the control logic 130 may control the peripheral circuit 120 to select the second source selection line SSL2, which is the next source selection line (at operation S120), perform the verification operation on a group of the source selection transistors SST connected to the selected second source selection line SSL2, and store the verification result in one (e.g., the second data latch circuit 330_2) of the data latch circuits 330 of the first to m-th page buffers PB1 to PBm (at operation S130).

Figure 13A:
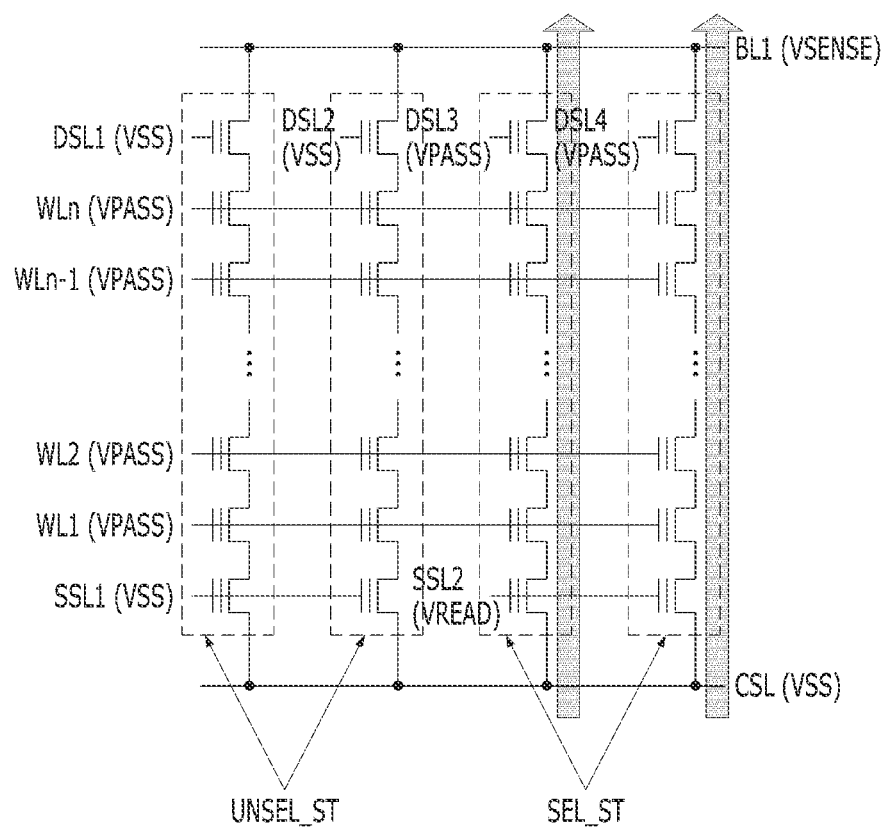
Figure 13B:
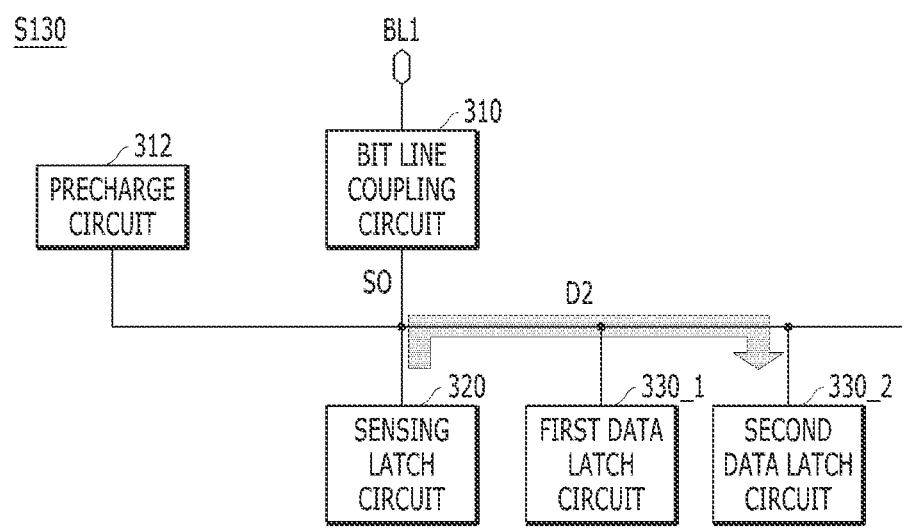

Referring to FIG. 13A, the control logic 130 may control the peripheral circuit 120 to perform the verification operation in a manner similar to that described in FIGS. 10A and 10B. Accordingly, the drain selection transistors DST, the memory cells MC1 to MCn, and the source selection transistors SST of the cell strings (SEL_ST of FIG. 13A) connected to the selected second source selection line SSL2 may be turned on. On the other hand, the drain selection transistors DST and the source selection transistors SST of the cell strings (UNSEL_ST of FIG. 13A) connected to the unselected first source selection line SSL1 may be turned off. The control logic 130 may control the first to m-th page buffers PB1 to PBm to store a change in voltage or current output through the first bit line BL1 from the cell strings SEL_ST connected to the selected second source selection line SSL2, into the second data latch circuit 330_2. Referring to FIG. 13B, the bit line coupling circuit 310 may sense the data transmitted through the first bit line BL1 and transmit the sensed data to the sensing node SO. The sensing latch circuit 320 may store the sensing data depending on output data transmitted through the first bit line BL1, and may dump the stored sensing data into the second data latch circuit 330_2 (as shown in D2), Accordingly, the verification result of the group of the source selection transistors SST connected to the second source selection line SSL2 may be stored in the second data latch circuit 330_2.

Figure 14A:
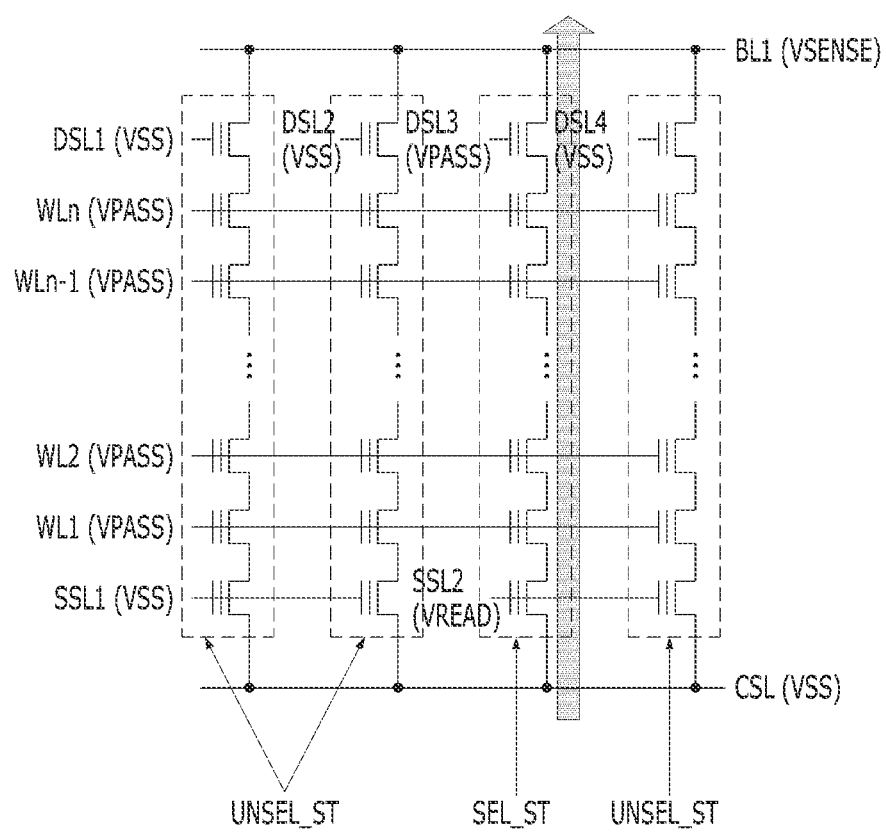
Figure 14B:
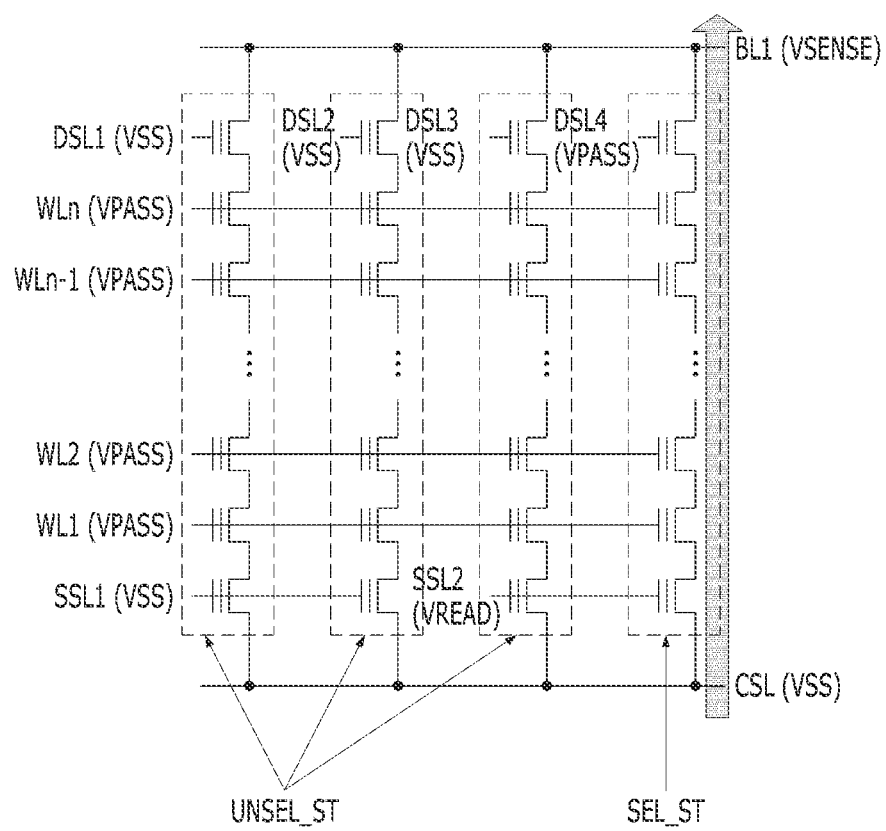

According to another embodiment, during the verification operation, the control logic 130 may control the row decoder 121 and the voltage generator 122 to sequentially select the cell strings connected to the selected second source selection line SSL2. For example, referring to FIG. 14A, the row decoder 121 and the voltage generator 122 may select a cell string SEL_ST by applying the pass voltage VPASS to only the third drain selection line DSL3. The sensing latch circuit 320 may store the sensing data depending on output data transmitted through the first bit line BL1, Thereafter, referring to FIC. 14B, the row decoder 121 and the voltage generator 122 may select a cell string SEL_ST by applying the pass voltage VPASS only to the fourth drain selection line DSL4. The sensing latch circuit 320 may store the sensing data depending on output data transmitted through the first bit line BL1. In this case, if any of the selected cell strings SEL_ST in FIG. 14A or SEL_ST in FIG. 14B is normally programmed, the sensing data stored in the sensing latch circuit 320 may be stored accordingly as the program operation has finally passed. As described in FIG. 13B, the control logic 130 may control the first to m-th page buffers PB1 to PBm to dump the sensing data stored in the sensing latch circuit 320 into the second data latch circuit 330_2 (as shown in D2). Accordingly, the verification result of the group of the source selection transistors SST connected to the second source selection line SSL2 may be stored in the second data latch circuit 330_2.

Referring back to FIG. 6, when the verification results for all source selection lines are stored in the data latch circuits ("YES" in operation S140), the control logic 130 may set an operational voltage for each group of source selection transistors SST using the verification results stored in the first data latch circuit 3301 and the second data latch circuit 3302 (at operation S150). In this case, the operating voltage may be a voltage for turning on the source selection transistors SST during a subsequent program or read operation on the memory cells of each page.

Figure 15:
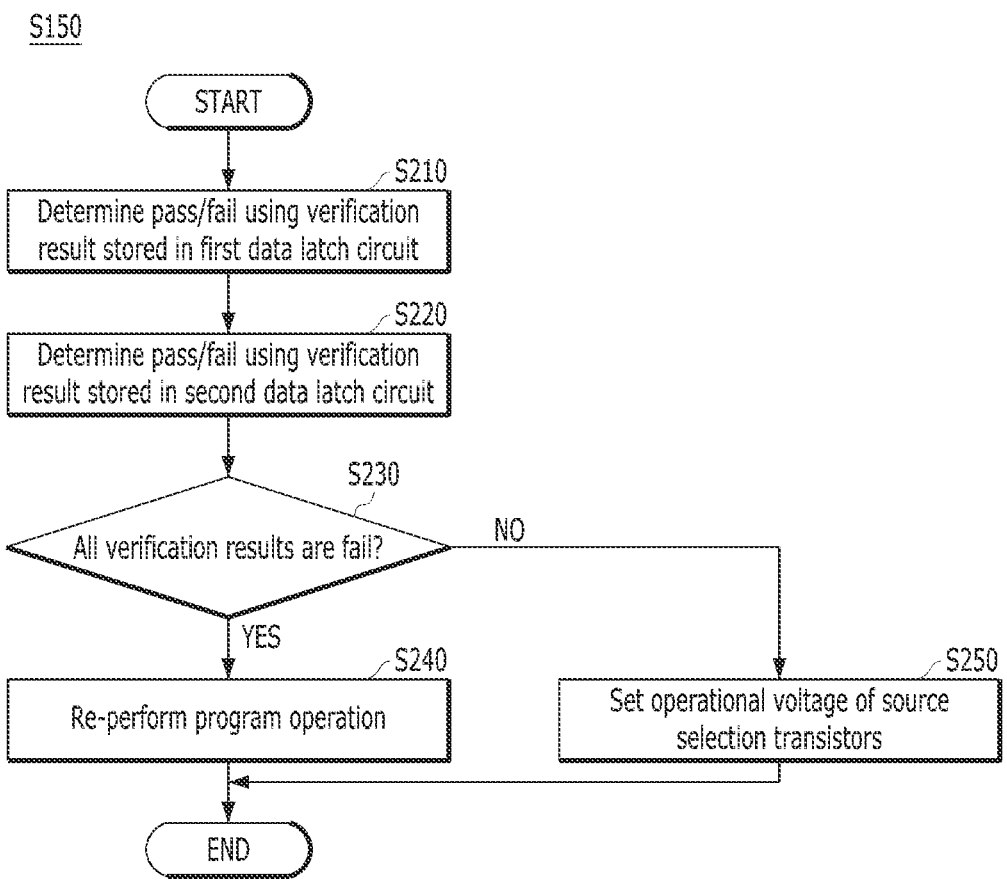
FIG. 15 is a flowchart for describing an operation of setting an operation voltage according to an embodiment of the present invention.

FIG. 15 is a flowchart for describing an operation of setting an operation voltage (S150 of FIG. 6) according to an embodiment of the present invention.

Referring to FIG. 15, the control logic 130 may set the operational voltage for each group of the source selection transistors SST using the verification results stored in the first data latch circuit 330_1 and the second data latch circuit 330_2. First, the control logic 130 may determine whether the program operation of the source selection transistors SST connected to the first source selection line SSL1 is pass or fail based on the verification result (hereinafter, a first verification result) stored in the first data latch circuit 330_1 (at operation S210). In addition, the control logic 130 may determine whether the program operation of the source selection transistors SST connected to the second source selection line SSL2 is pass or fail based on the verification result stored in the second data latch circuit 330_2 (hereinafter, a second verification result) (at operation S220).

According to an embodiment, the sensing circuit 126 of the peripheral circuit 120 may output the pass or fail signal PASS/FAIL by comparing a reference voltage with the sensing voltage VPB corresponding to the first verification result, in response to the enable bit signal VRYBIT provided from the control logic 130. The sensing circuit 126 may output the pass or fail signal PASS/FAIL by comparing the reference voltage with the sensing voltage VPB corresponding to the second verification result, in response to the enable bit signal VRYBIT.

If all of the first and second verification results are confirmed to be fail ("YES" in operation S230), the control logic 130 may determine that the program operation of the source selection transistors SST has failed, and control the peripheral circuit 120 to re-perform the program operation and the verification operation described in FIGS. 6 to 14B (at operation S240). In this case, a voltage level of the program voltage VPGM applied to the source selection transistors SST may be adjusted to be increased or decreased.

If any of the first and second verification results is confirmed as a pass ("NO" in operation S230), the control logic 130 may set the operational voltage for each group of the source selection transistors SST according to the verification result confirmed as a pass (at operation S250). For example, if the first verification result is a pass and the second verification result is a fail, the control logic 130 may set the operational voltage of the source selection transistors SST connected to the first source selection line SSL1, to a voltage level corresponding to the program voltage VPGM, while setting the operational voltage of the source selection transistors SST connected to the second source selection line SSL2, to a voltage level lower than the program voltage VPGM. Conversely, when the first verification result is a fail and the second verification result is confirmed as a pass, the control logic 130 may set the operational voltage of the source selection transistors SST connected to the second source selection line SSL2, to a voltage level corresponding to the program voltage VPGM, while setting the operational voltage of the source selection transistors SST connected to the first source selection line SSL1, to a voltage level lower than the program voltage VPGM. That is, the control logic 130 may set the operational voltage of the group of the source selection transistors SST whose verification result is a fail, to be lower than the operational voltage of the group of the source selection transistors SST whose verification result is a pass.

As described above, in accordance with an embodiment of the present invention, the source selection transistors SST connected to all source selection lines may be programmed at once, and verified for each group of source selection transistors SST connected to the same source selection line. Accordingly, the execution time of the program operation of the source selection transistors SST may be reduced, and the damage to the drain selection lines during the program operation may be minimized. In addition, the operation characteristics may be improved by individually adjusting the voltage of the source selection lines based on the verification results stored for each group of the source selection transistors SST.

In the above embodiments, a method of programming the source selection transistors connected to the source selection lines has been described, but the present invention is not limited thereto, and may also be applied to program the drain selection transistors connected to the drain selection lines. That is, the drain selection transistors connected to all drain selection lines may be programmed at once and then verified for each group of the drain selection transistors connected to the same drain selection line.

Various embodiments of the present invention have been described in the drawings and specification. Although specific terminologies are used here, the terminologies are only to describe the embodiments of the present invention. Therefore, the present invention is not restricted to the above-described embodiments and many variations are possible within the spirit and scope of the present invention. It should be apparent to those skilled in the art that various modifications can be made based on the technological scope of the present invention in addition to the embodiments disclosed herein. The embodiments may be combined to form additional embodiments.

It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of the disclosure and the following claims.

For example, for the logic gates and transistors provided as examples in the above-described embodiments, different positions and types may be implemented depending on the polarity of the input signal. Furthermore, the embodiments may be combined to form additional embodiments.

What is claimed is:

1. An operating method of a non-volatile memory device, the operating method comprising:
    simultaneously performing a program operation on a plurality of selection transistors included in a plurality of cell strings each including a corresponding selection transistor of the selection transistors and a plurality of memory cells, each of the cell strings being coupled between a common source line and a corresponding bit line of a plurality of bit lines;
    sequentially performing verification operations on respective groups of the selection transistors, the groups being coupled to respective selection lines; and
    sequentially storing results of the verification operations into respective data latch circuits within each of a plurality of page buffers coupled to the bit lines.

2. The operating method of claim 1, further comprising setting an operational voltage for each of the groups using the stored results.

3. The operating method of claim 2, wherein the setting includes setting the operational voltage of a group, for which the stored result represents a fail, to be lower than the operational voltage of a group, for which the stored result represents a pass, among the groups.

4. The operating method of claim 1, further comprising repeating the simultaneously performing, the sequentially performing and the sequentially storing when all stored results represent a fail.

5. The operating method of claim 4, further comprising adjusting a voltage level of a program voltage to be applied to the selection transistors before the repeating.

6. The operating method of claim 1, wherein the program operation is performed by:
    applying a ground voltage to the bit lines and the common source line;
    applying a pass voltage greater than the ground voltage, to a plurality of word lines coupled to the memory cells; and
    applying a program voltage greater than the pass voltage, to the selection lines coupled to the selection transistors.

7. The operating method of claim 1, wherein each of the verification operations is performed by:
    providing a sensing voltage to the bit lines;
    applying a ground voltage to the common source line; and
    applying a read voltage greater than the ground voltage, to the selected selection line, while applying the ground voltage to unselected selection lines.

8. A non-volatile memory device comprising:
    a plurality of cell strings each including a corresponding one of a plurality of source selection transistors and a plurality of memory cells, each of the cell strings being coupled between a common source line and a corresponding bit line of a plurality of bit lines;
    a peripheral circuit including a plurality of page buffers coupled to the cell strings through the respective bit lines, the peripheral circuit being coupled to the source selection transistors through a plurality of source selection lines and coupled to the memory cells through a plurality of word lines; and
    a control logic configured to control the peripheral circuit to:
    simultaneously perform a program operation on the source selection transistors,
    sequentially perform verification operations on respective groups of the source selection transistors, the groups being coupled to the respective source selection lines, and
    sequentially store results of the verification operations into respective data latch circuits within each of the page buffers.

9. The non-volatile memory device of claim 8, wherein the control logic is further configured to set an operational voltage for each of the groups using the stored results.

10. The non-volatile memory device of claim 9, wherein the control logic is configured to set the operational voltage of a group, for which the stored result represents a fail, to be lower than the operational voltage of a group, for which the stored result represents a pass, among the groups.

11. The non-volatile memory device of claim 8, wherein, during the program operation, the control logic is configured to:
apply a ground voltage to the bit lines and the common source line;
apply a pass voltage greater than the ground voltage, to the word lines; and
apply a program voltage greater than the pass voltage, to the source selection lines.

12. The non-volatile memory device of claim 8, wherein, during the verification operations, the control logic is configured to:
provide a sensing voltage to the bit lines;
apply a ground voltage to the common source line; and
apply a read voltage greater than the ground voltage, to the selected source selection line, while applying the ground voltage to unselected source selection lines.

13. The non-volatile memory device of claim 8, wherein each of the cell strings further includes at least one drain selection transistor coupled between the corresponding bit line and an uppermost memory cell among the memory cells.

14. The non-volatile memory device of claim 13, wherein the control logic is configured to control the peripheral circuit further to apply a ground voltage or a drain selection voltage having a voltage level capable of turning on the drain selection transistor, to a drain selection line coupled to the drain selection transistor, during the program operation.

15. The non-volatile memory device of claim 8,
wherein each page buffer includes:
a bit line coupling circuit configured to transfer data to a sensing node from a corresponding bit line according to a coupling control signal;
a sensing latch circuit configured to store sensing data by sensing a change in a voltage level at the sensing node according to a sensing latch control signal; and
the data latch circuits configured to sequentially store the sensing data according to a plurality of data control signals, and
wherein the control logic is further configured to provide the coupling control signal, the sensing latch control signal, and the data control signals.

16. The non-volatile memory device of claim 15, wherein the bit line coupling circuit is configured to precharge the corresponding bit line to a ground voltage during the program operation.

17. The non-volatile memory device of claim 15, wherein the sensing latch circuit is configured to precharge the corresponding bit line to a ground voltage by setting the sensing data to a specific logic level during the program operation.

18. A non-volatile memory device comprising:
cell strings coupled between a bit line and a common source line, each of the cell strings including a selection transistor and memory cells serially coupled to each other, and the selection transistors of the cell strings being classified into groups coupled to respective selection lines; and
a control circuit configured to:
perform a program operation simultaneously on the selection transistors,
perform verification operations on the respective groups to latch results of the respective verification operations, and
adjust an operational voltage for a group, for which the latched result represents a fail, to a level lower than the operational voltage for a group, for which the latched result represents a pass, among the groups.

* * * * *